(12) United States Patent
Sato et al.

(10) Patent No.: US 6,278,149 B1
(45) Date of Patent: *Aug. 21, 2001

(54) PLURALITY OF TRENCH CAPACITORS USED FOR THE PERIPHERAL CIRCUIT

(75) Inventors: Wataru Sato; Yoshiaki Asao, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,191

(22) Filed: Sep. 3, 1998

(30) Foreign Application Priority Data

Sep. 4, 1997 (JP) .................................................. 9-239594
Aug. 28, 1998 (JP) ................................................ 10-243760

(51) Int. Cl.[7] ............................................... H01L 31/119
(52) U.S. Cl. ..................... 257/301; 257/300; 257/304; 257/311; 257/296; 257/906; 257/908
(58) Field of Search ................................. 257/300, 301, 257/304, 311, 296, 906, 908

(56) References Cited

U.S. PATENT DOCUMENTS

| | | | |
|---|---|---|---|
| 5,256,588 | * 10/1993 | Witek et al. | 437/52 |
| 5,442,584 | * 8/1995 | Jeong et al. | 365/149 |
| 5,525,531 | * 6/1996 | Bronner et al. | 437/52 |
| 5,698,878 | * 12/1997 | Miyashita et al. | 257/301 |
| 5,731,941 | * 3/1998 | Hargrove et al. | 361/56 |
| 5,792,680 | * 8/1998 | Sung et al. | 438/210 |
| 5,805,494 | * 9/1998 | El-Kareh et al. | 365/149 |

FOREIGN PATENT DOCUMENTS

| | | | |
|---|---|---|---|
| 2231718A | * 11/1990 | (GB) | H01L/27/10 |
| 62-298155 | * 6/1986 | (JP) | 257/301 |
| 2-153560 | 6/1990 | (JP) . | |
| 6-5809 | 1/1994 | (JP) . | |
| 62-179145 | * 8/1997 | (JP) | 257/304 |

* cited by examiner

*Primary Examiner*—Mahshid Saadat
*Assistant Examiner*—Matthew E. Warren
(74) *Attorney, Agent, or Firm*—Banner & Witcoff, Ltd.

(57) ABSTRACT

In a DRAM-logic embedded integrated circuit in which a DRAM including trench capacitors of the deep trench structure and a logic circuit are mixedly formed in a semiconductor substrate, a plurality of capacitors of the deep trench structure are provided in the logic circuit portion. The plurality of capacitors are connected in parallel by wiring portions, whereby a plurality of capacitor blocks are formed. Between the respective capacitor blocks, there are provided fuse elements which selectively connect the respective wiring portions to each other or selectively separate them from each other to thereby vary the capacitance value of the capacitance blocks. These fuse elements are selectively cut off depending on the capacitance value of the capacitors required in view of the circuit design.

13 Claims, 17 Drawing Sheets

PLURALITY OF TRENCH CAPACITORS USED FOR THE PERIPHERAL CIRCUIT

BACKGROUND OF THE INVENTION

The present invention relates to a semiconductor device with trench type capacitors and, more particularly, to the capacitor structure in the logic circuit portion of a DRAM/logic embedded integrated circuit.

In a conventional embedded integrated circuit in which a DRAM and a logic circuit such as MPU or the like, are mixedly disposed, the capacitors provided in the logic circuit portion are realized by the use of planar type capacitors structure. It is because, though trench type capacitors are used in the memory cells in the DRAM portion, the capacitance value thereof is small, so that they are not practically suitable for use in the logic circuit portion.

However, if planar type capacitors are used in the logic circuit portion in order to realize a desired magnitude of capacitance such as, e.g. the power supply stabilization capacitance of a stabilized power supply circuit, then the pattern area occupied by the capacitors becomes large, so that the degree of freedom in the circuit design lowers.

Further, in the case of the conventional DRAM/logic embedded integrated circuit, if the capacitance value of the capacitors is to be altered in the logic circuit portion as required in view of the circuit design from chip to chip, then the manufacturing steps must be altered, the chip-wise alteration is thus difficult.

BRIEF SUMMARY OF THE INVENTION

Accordingly, it is a first object of the present invention to provide a semiconductor device constituted in such a manner that, in realizing a desired capacitance value, the pattern area occupied by the capacitors can be reduced, and yet, the degree of freedom in the circuit design can be enhanced.

A second object of the present invention is to provide a semiconductor device constituted in such a manner that the capacitance value of the capacitors required in view of the circuit design can be easily altered from chip to chip.

The first object of the present invention can be achieved by a semiconductor device which comprises a plurality of trench type capacitors formed in a semiconductor substrate, and a wiring portion which electrically connects the plurality of capacitors to form at least one capacitor block.

According to the above-mentioned structure, a plurality of trench type capacitors are connected in parallel to form at least one capacitor block, so that, by the use of this capacitor block, a desired magnitude or value of capacitance can be realized, and therefore, the pattern area occupied by the capacitors can be reduced, and the degree of freedom in the circuit design can be enhanced.

Further, the above-mentioned second object of the present invention can be realized by a semiconductor device which comprises a plurality of trench type capacitors formed in a semiconductor substrate, wiring portions which electrically connect the plurality of trench type capacitors to form a plurality of capacitor blocks, and connection/separation means which selectively connects the respective above-mentioned wiring portions to each other or selectively separates them from each other to thereby vary the capacitance values of the capacitor blocks.

According to the above-mentioned structure, a plurality of capacitor blocks each comprising a plurality of trench type capacitors connected in parallel can be selectively connected for use, so that the capacitance value of the capacitors required in view of the circuit design can be easily altered.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIGS. 1A to 1E, FIGS. 2A to 2E, FIGS. 3A to 3E, and FIGS. 4A to 4E are schematic diagrams for explaining the semiconductor device according to a first embodiment of the present invention, respectively, of which FIGS. 1A to 1E are plan views showing an example of pattern formation in the DRAM portion of the DRAM-logic embedded integrated circuit in the order of the manufacturing steps, FIGS. 2A to 2E are sectional views taken along the lines 2A—2A to 2E—2E in the FIGS. 1A to 1E, respectively. Further, FIGS. 3A to 3E are plan views showing, in the order of the manufacturing steps, an example of the pattern formation in the capacitor block portion formed in the logic circuit portion of the DRAM-logic embedded integrated circuit, and FIGS. 4A to 4E are sectional views taken along the lines 4A—4A to 4E—4E in FIGS. 3A to 3E, respectively.

Figure 1A:
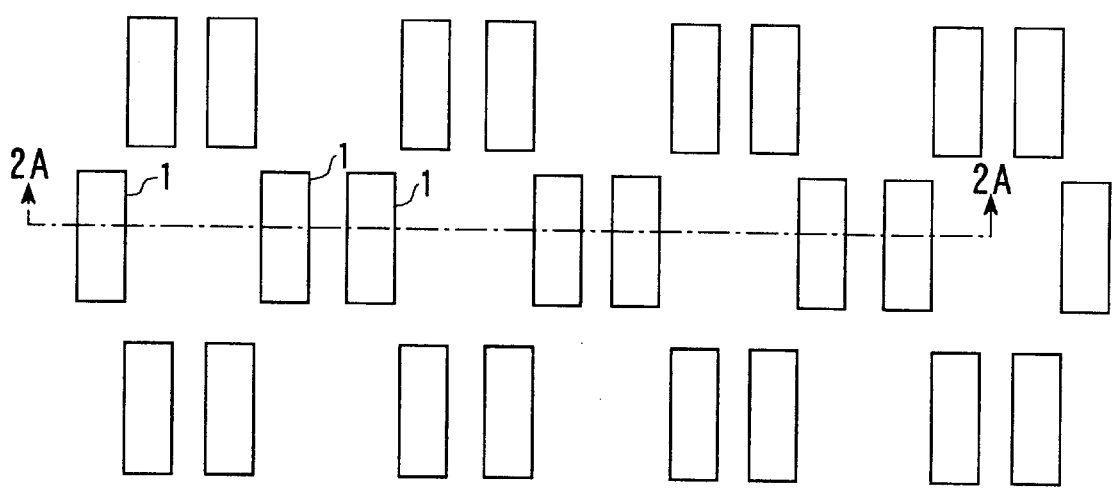
FIGS. 1A to 1E are, respectively, plan views for explaining the semiconductor device according to a first embodiment of the present invention, showing an example of the pattern formation of the DRAM portion of the DRAM-logic embedded integrated circuit in the order of the manufacturing steps.
Figure 2A:
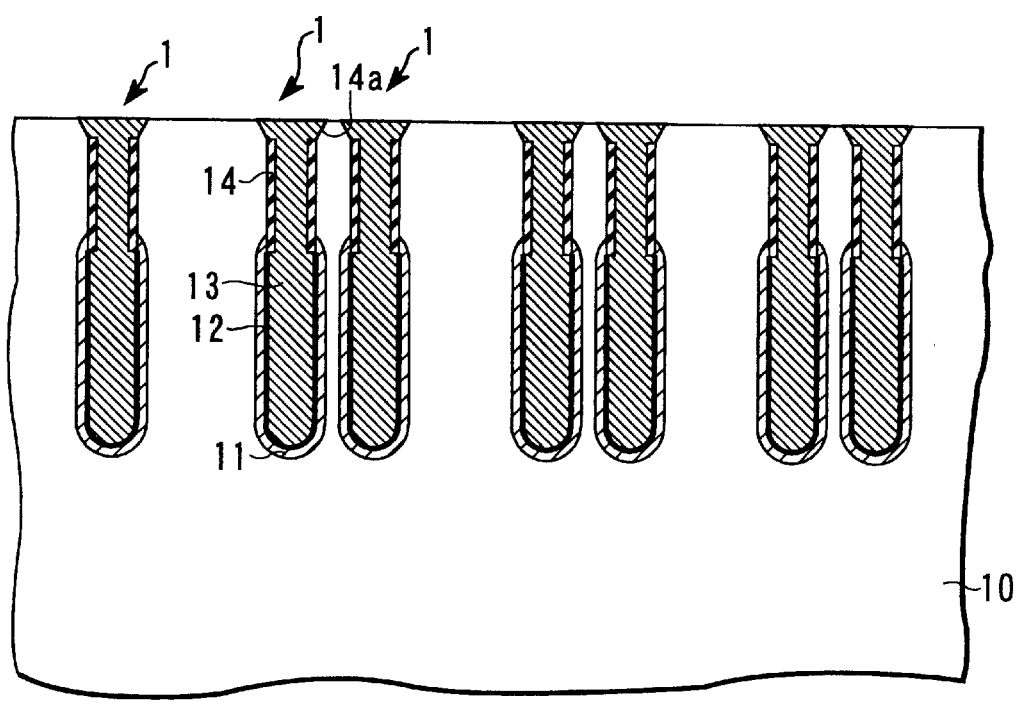
FIGS. 2A to 2E are sectional views taken along the lines 2A—2A to 2E—2E in the FIGS. 1A to 1E, respectively.
Figure 2B:
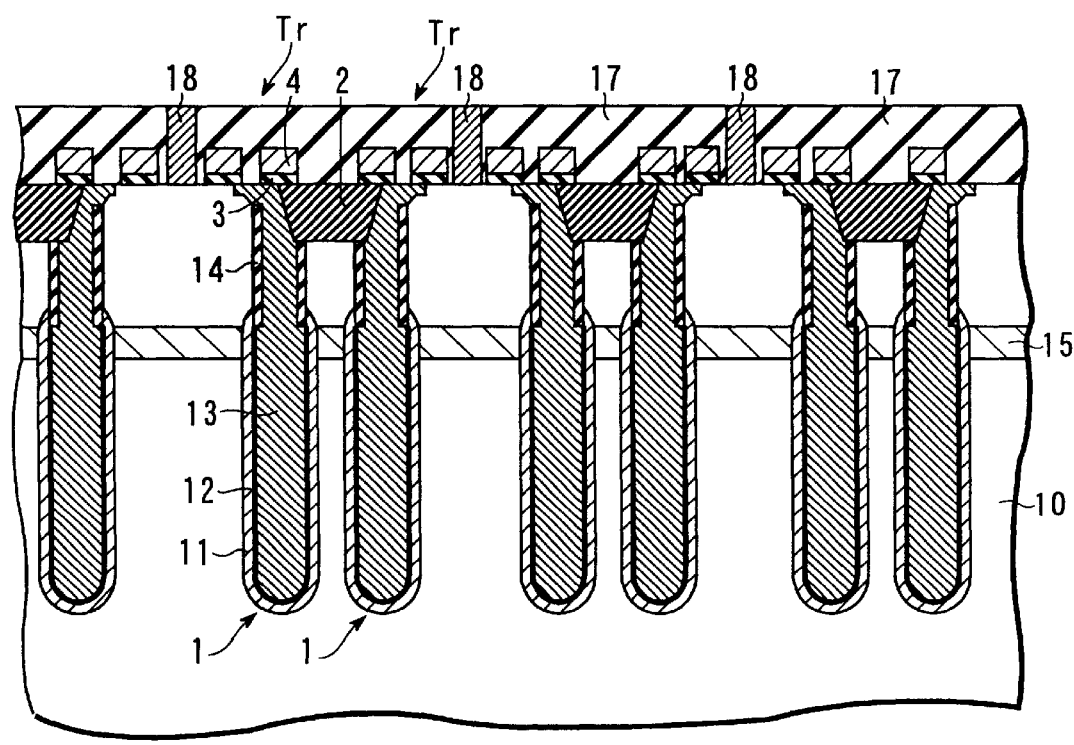
Figure 2C:
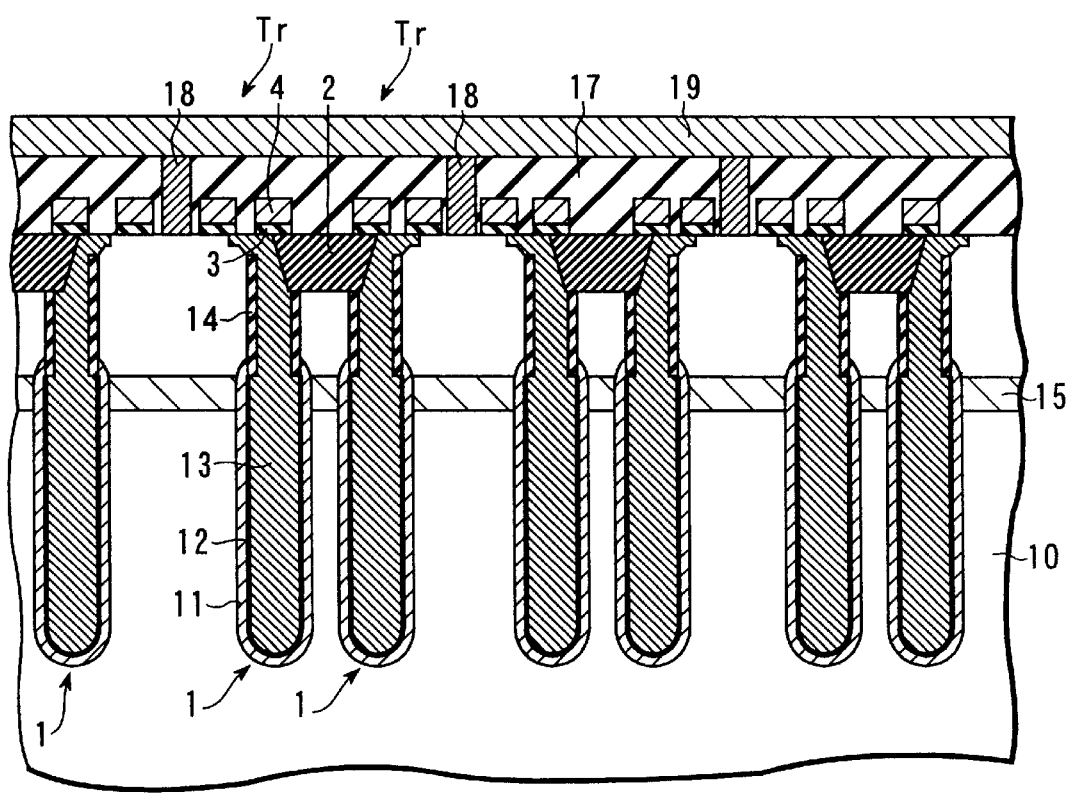
Figure 2D:
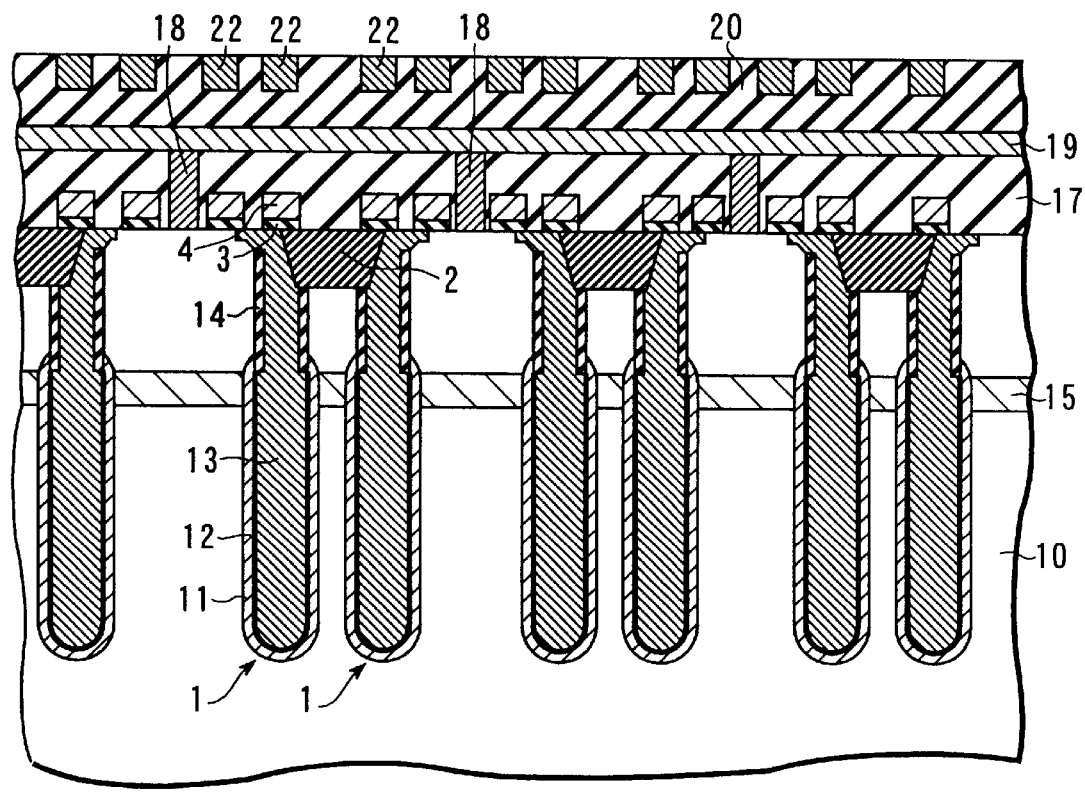
Figure 3A:
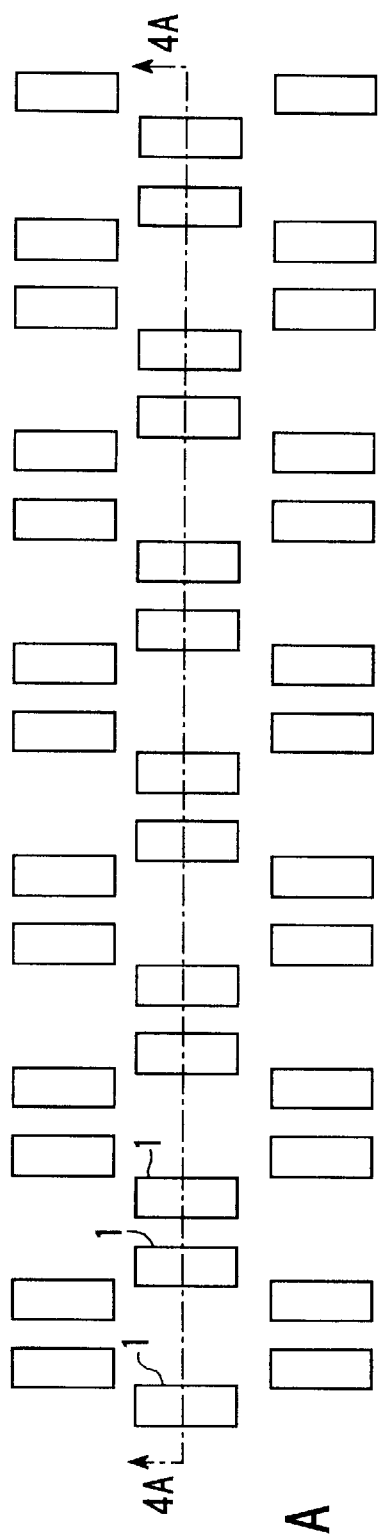
FIGS. 3A to 3E are, respectively, plan views for explaining the semiconductor device according to the first embodiment, showing an example of the pattern formation of the capacitor block portion formed in the logic circuit portion of the DRAM-logic embedded integrated circuit.
Figure 4A:
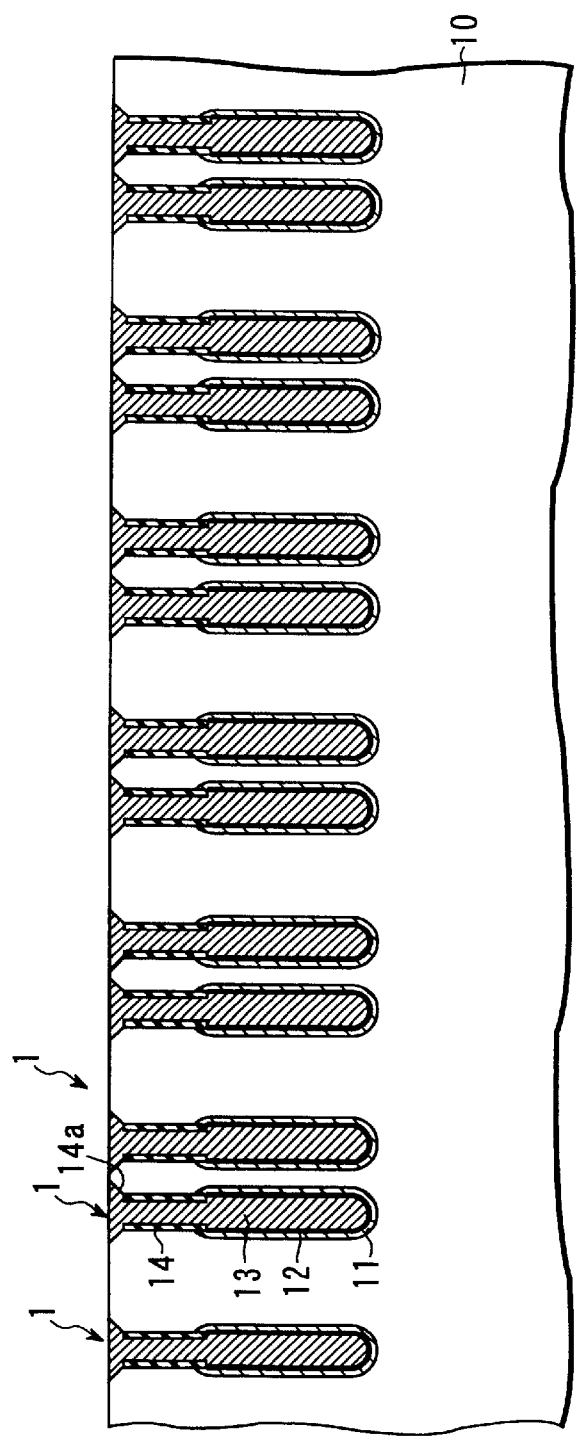
FIGS. 4A to 4E are sectional views taken along the lines 4A—4A to 4E—4E in the pattern shown in FIGS. 3A to 3E.
Figure 4B:
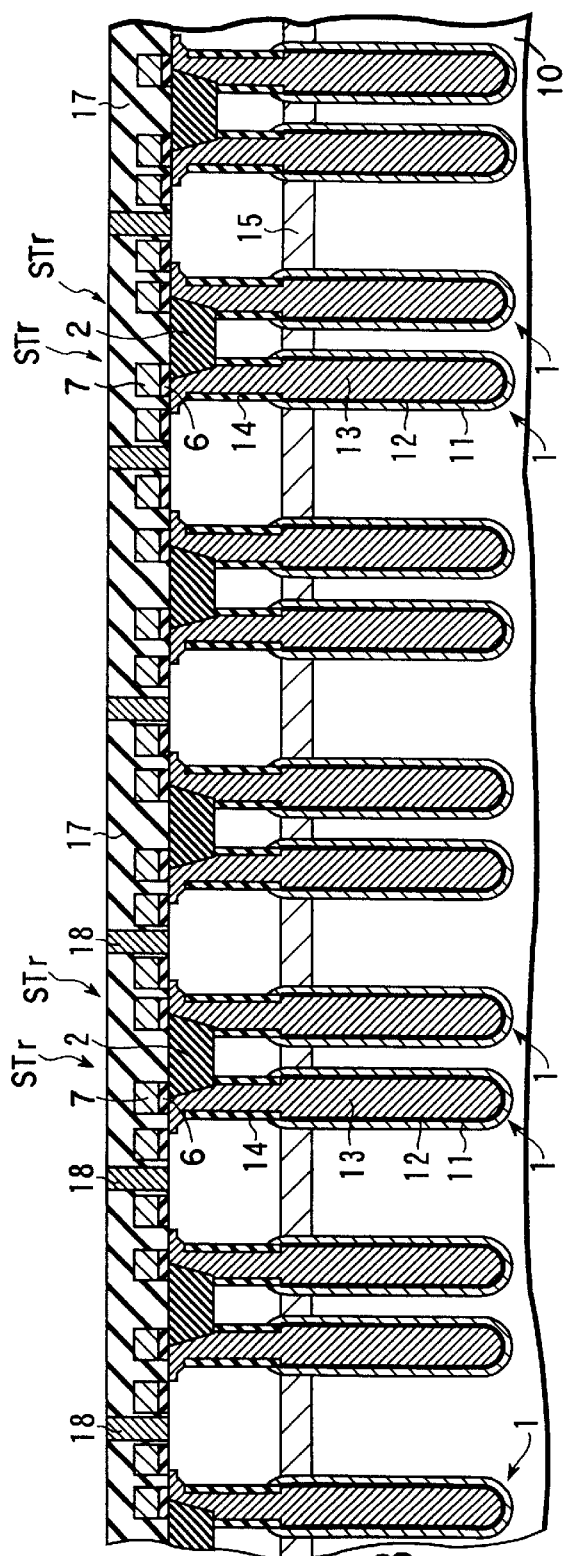
Figure 4C:
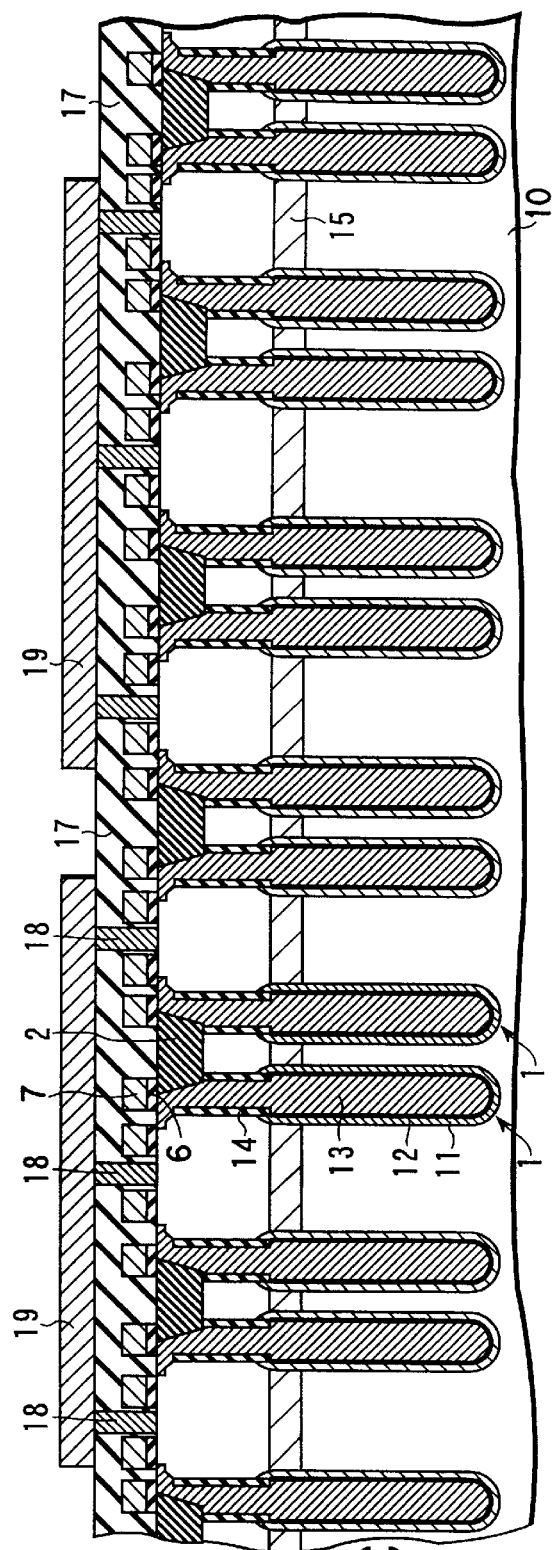
Figure 4D:
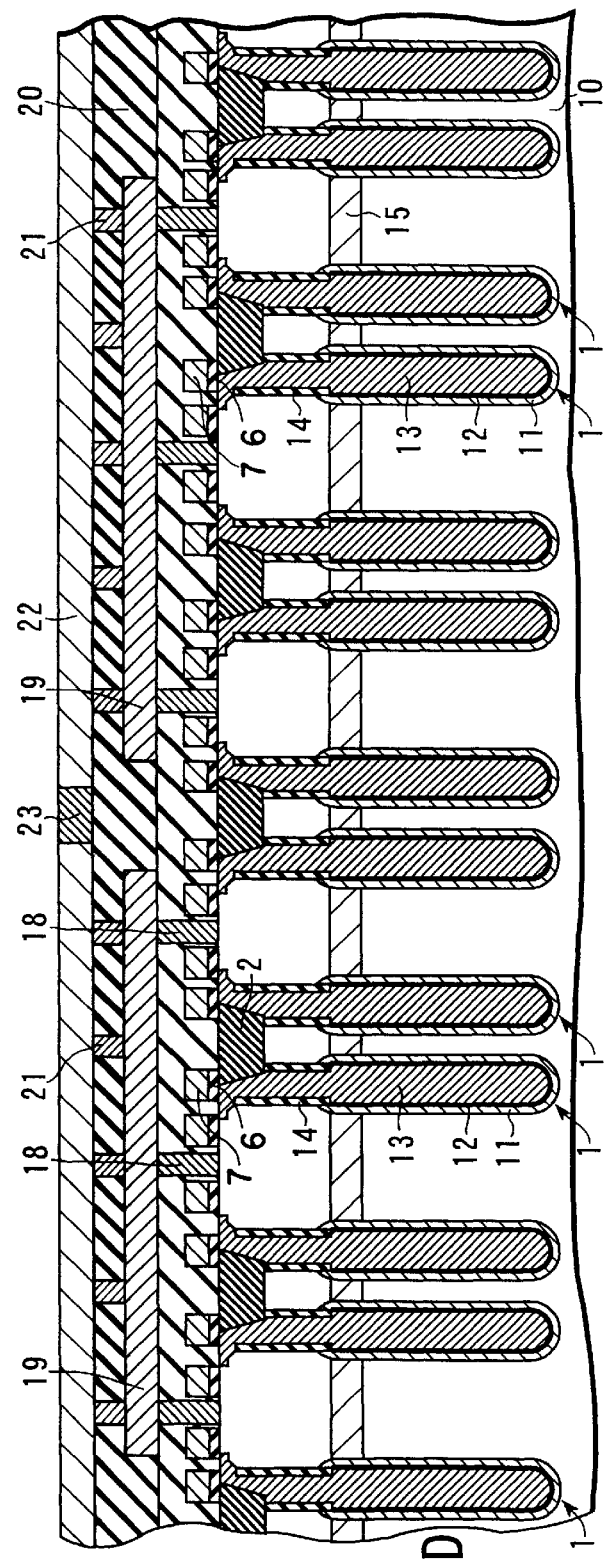

As shown in FIGS. 1A and 2A, in the DRAM portion of the DRAM-logic embedded integrated circuit, trench type capacitors (deep trench type capacitors in this embodiment) are formed in accordance with a known manufacturing process. Further, when the deep trench type capacitors are formed in this DRAM portion, trench type capacitors are also formed in the logic circuit portion in accordance with the same manufacturing process used for the DRAM portion, as shown in FIGS. 3A and 4A. The trench type capacitors formed in this logic circuit portion are basically disposed in a zigzag (or stagger) pattern as in the case of the DRAM portion, but, in order to form a plurality of capacitor blocks, they are formed in such a pattern that they are separated from capacitor block to capacitor block excepting fuse element forming region which will be described later.

That is, first by the use of an anisotropic etching method such as the RIE method or the like, a plurality of trenches 1 are formed in a state arranged in a zigzag lattice-like pattern in the major surface of a semiconductor substrate (silicon substrate) 10. Thereafter, in each of the trenches 1, a capacitor electrode 11, a capacitor insulation film 12, a charge storage layer 13, a collar 14, a buried strap (an opening portion) 14a, etc. are formed. The capacitor electrodes 11 are each formed in the surface portion (surface layer portion) of the lower portion of the trench 1 by, e.g. a diffused layer formed by introducing, e.g. an n-type impurity (in case the semiconductor substrate 10 is of the p-type). The capacitor insulation film 12 is, for instance, an NO film, which is formed on the surface of the capacitor electrode (diffused layer) 11 in the trench 1. The charge storage layer 13 is composed of, e.g. n-type polycrystalline silicon and buried in the trench 1. The collar 14 comprises an insulation film (such as, e.g. an oxide film) formed on the side wall in the upper portion of the trench 1. Further, the buriedstrap 14a is formed on a overlap portion of the collar 14 and an active region.

Next, as shown in FIGS. 1B, 2B and 3B, 4B, a buried plate 15 is formed in the semiconductor substrate 10 in which the trench type capacitors are formed, so that the plate electrodes of the trench capacitors in the DRAM portion are connected in common, and at the same time, one electrodes of the trench capacitors in the logic circuit portion are connected in common. The buried-plate region 15 is formed in a state buried in the semiconductor substrate 10 by, e.g. the ion implantation of an impurity in such a manner as to connect together the upper portions of the respective capacitor electrodes of the plurality of capacitors. Thereafter, on the major surface of the semiconductor substrate 10, an STI-structure element isolation region 2 is formed to perform element isolation. Next, the gate insulation films 3, the gate electrodes 4, the source and drain regions, etc. of cell selection transistors Tr for selection of the memory cells in the DRAM portion are successively formed, whereby transistors constituting memory cells and a peripheral circuit are formed. When the memory cells are formed, in the regions between the trench capacitors in the logic circuit portion, the gate insulation films 6, the gate electrodes 7, the source and drain regions, etc. of transistors STr for selecting the capacitors are formed by the same process. Next, on the resultant semiconductor structure, a first inter-level insulation film (composed of, e.g. BPSG, PSG or the like) 17 is formed, and contact holes are formed in the first inter-level insulation films.

Subsequently, as shown in FIGS. 1C, 2C and 3C, 4C, a first-level metal layer comprised of, e.g. tungsten (W) or an Al—Cu alloy is formed, and thereafter, patterning is performed to form first-level metal wiring layers 19 electrically connected to the contact plugs 18. The first-level metal wiring layers 19 are formed so as to be contacted with the inter-trap junction diffused layer 16 at, e.g. a plurality of points. The pattern of these first-level metal wiring layers 19 are formed in the direction perpendicular to the gate electrodes 4 of the cell selecting transistors and are electrically connected to the trench capacitors through the contact portions. The pattern of the first-level metal wiring layers 19 in the logic circuit portion are also formed in the direction perpendicular to the gate electrodes 7 of the transistors and are electrically connected through the contact portions to the trench capacitors in every capacitor block.

Thereafter, as shown in FIGS. 1D, 2D and 3D, 4D, a second inter-level insulation film (composed of, e.g. BPSG, PSG or the like) 20 is formed on the first-level metal wiring layers 19 and the first inter-level insulation film 17. In this second inter-level insulation film 20, via holes are bored in those portions thereof which correspond to the first-level metal wiring layers 19. In the via holes, for instance tungsten W is buried in order to electrically connect to the first-level metal wiring layers 19, whereby second contact plugs 21 are formed. Further, on the second inter-level insulation film 20 between the respective capacitor blocks, fuse elements 23 comprised of, e.g. the same material as that of the second-level metal wiring layer, that is, Al—Cu alloy are selectively formed. These fuse elements 23 are formed so as to connect the second-level metal wiring layers of the plurality of capacitor blocks to each other. Next, on the second inter-level insulation film 20, a second-level metal wiring layer 22 is formed. This second-level metal wiring layer 22 is composed of for instance an Al—Cu alloy and formed along the direction perpendicular to the first-level metal wiring layer 19. Further, the first metal-wiring layers 19 in the capacitor block portions are connected in common in each of the capacitor blocks.

Here, after the fuse elements 23 are formed, the second-level metal wiring layer 22 is formed, but the fuse elements 23 may alternatively be formed by the same manufacturing step of forming the second-level metal wiring layer 22.

Next, as shown in FIGS. 1E, 2E and 3E, 4E, on the second-level metal wiring layer 22 and the second inter-level insulation film 20 in the DRAM portion and in the logic circuit portion, a surface protection film (passivation film) 24 is formed, and in those portions of the surface protection film which lie on the fuse elements 23, windows 25 are bored. The fuse elements 23 are adapted to be selectively blown out by laser irradiation or the like in accordance with the circuit design or the required capacitance value. By so doing, the connection between the respective wiring portions of the plurality of capacitor blocks can be selectively cut from each other by means of the fuse element 23.

In the DRAM-logic embedded integrated circuit, the uppermost-level metal wiring layer is so thick to blow out by laser irradiation, so that the lower-level metal wiring layer should desirably be used.

Figure 1B:
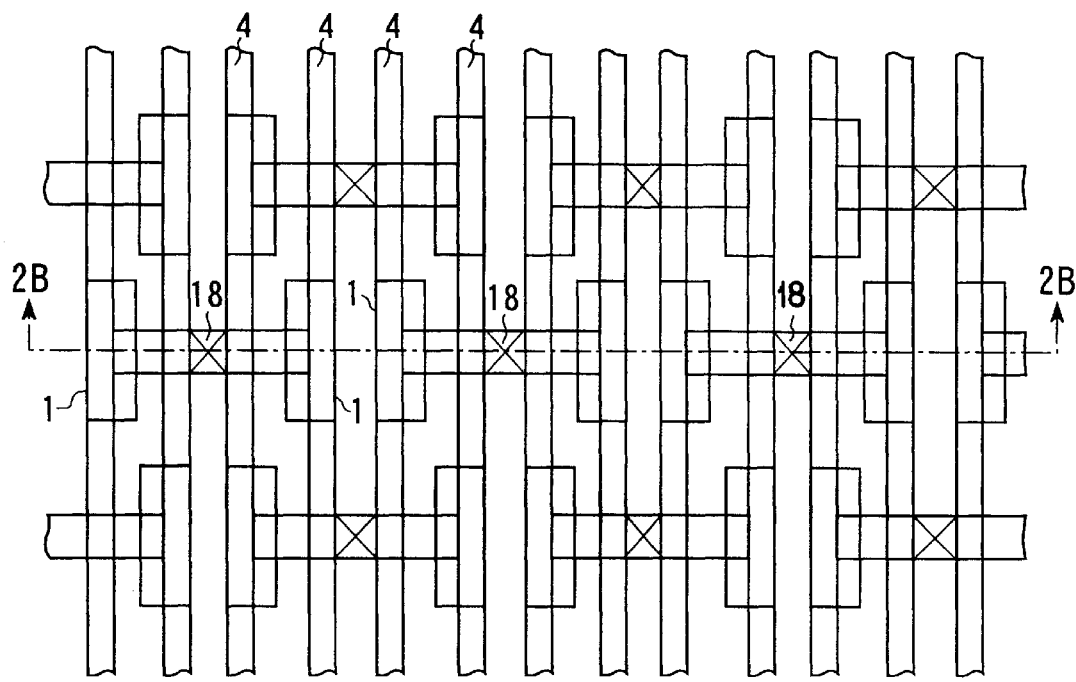
Figure 1C:
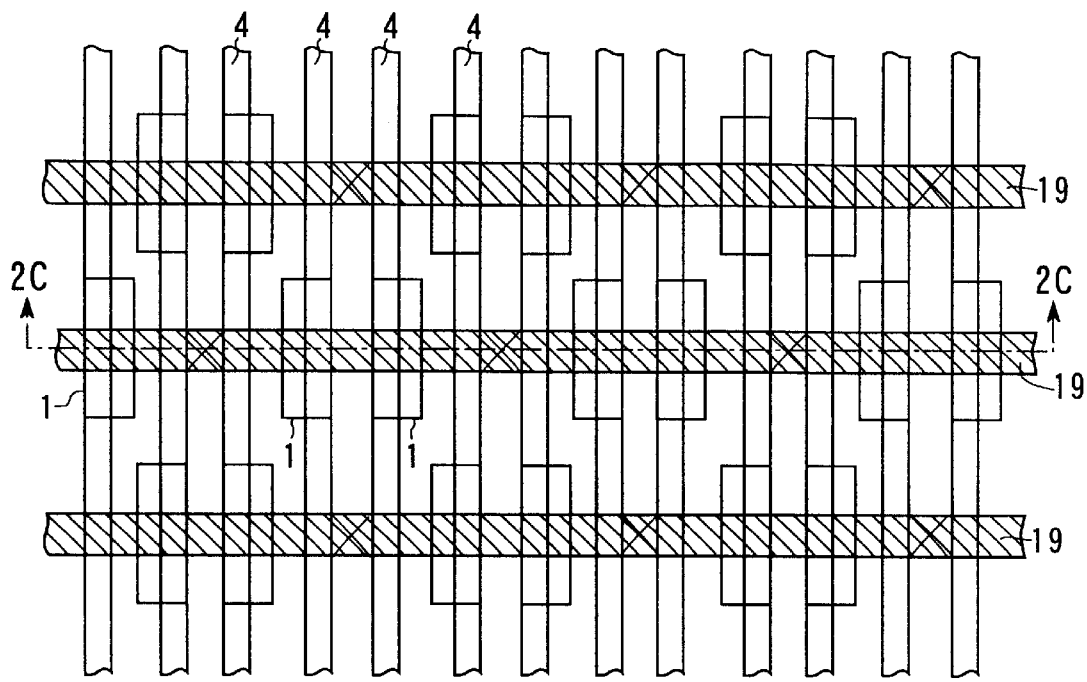
Figure 1D:
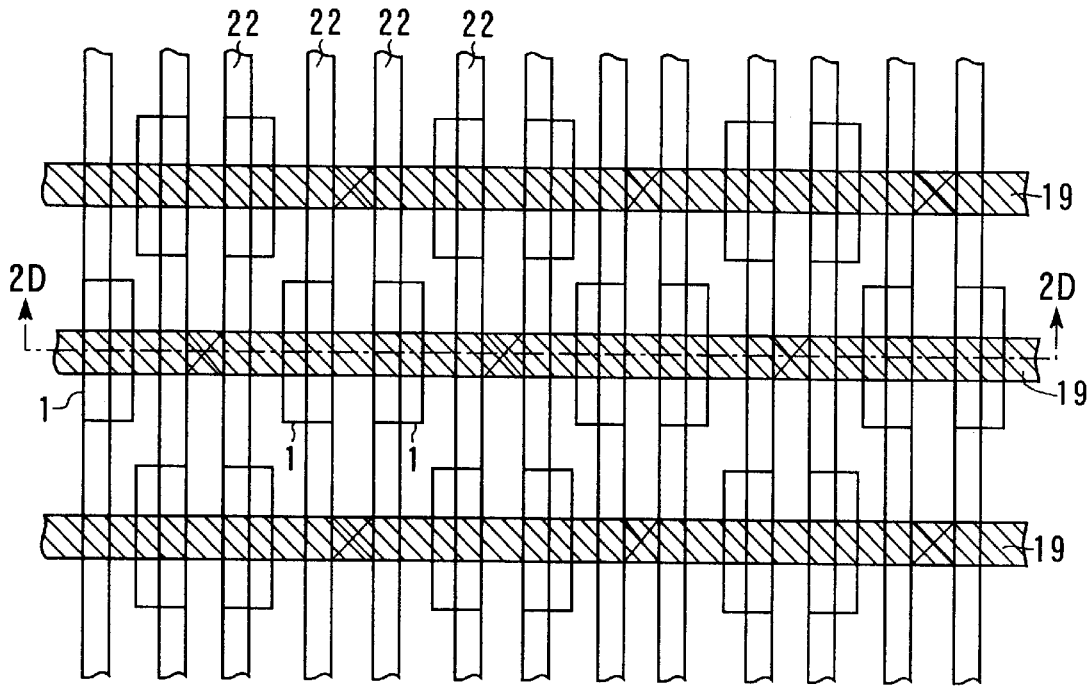
Figure 1E:
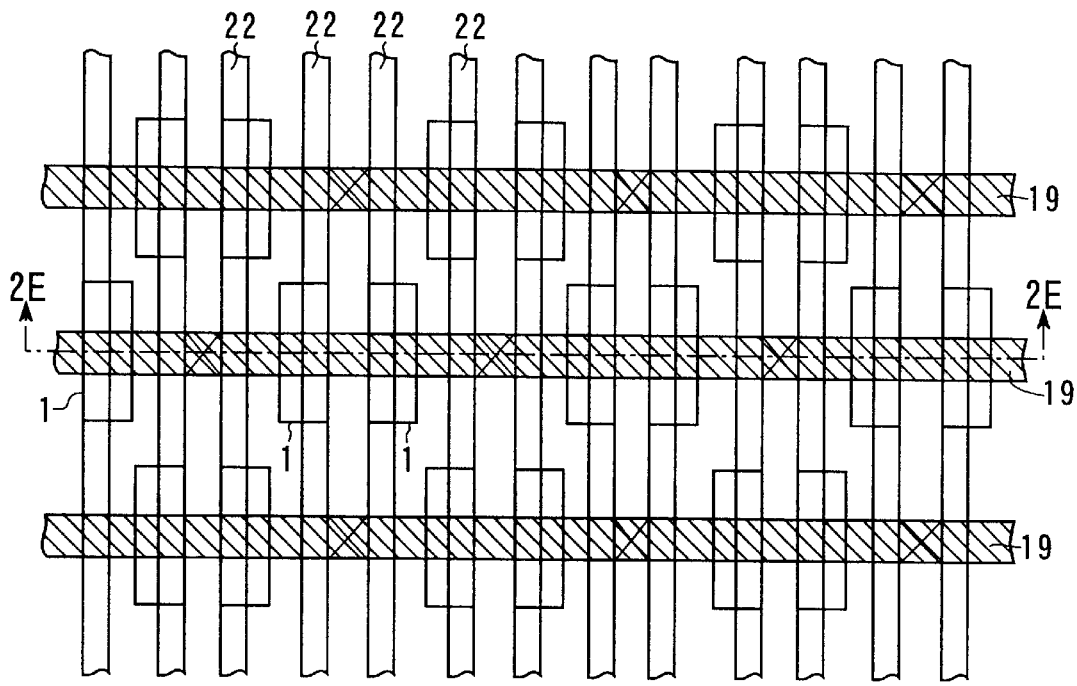
Figure 2E:
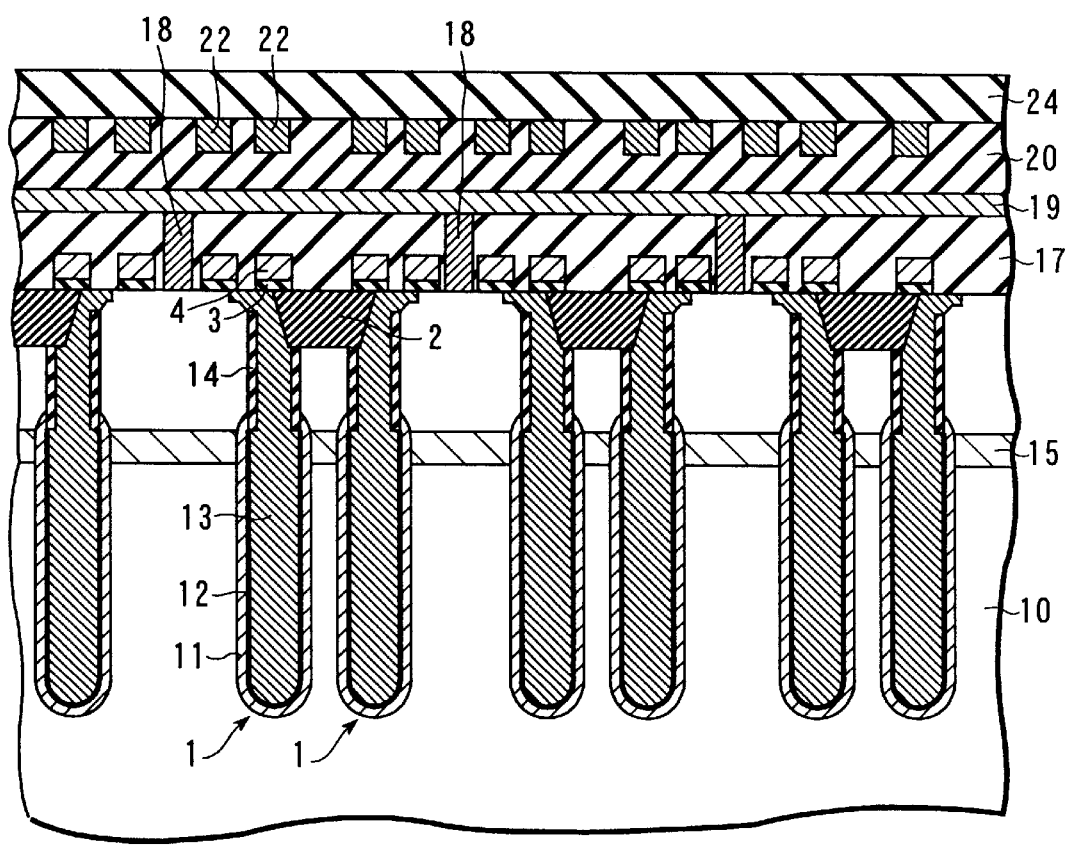
Figure 3B:
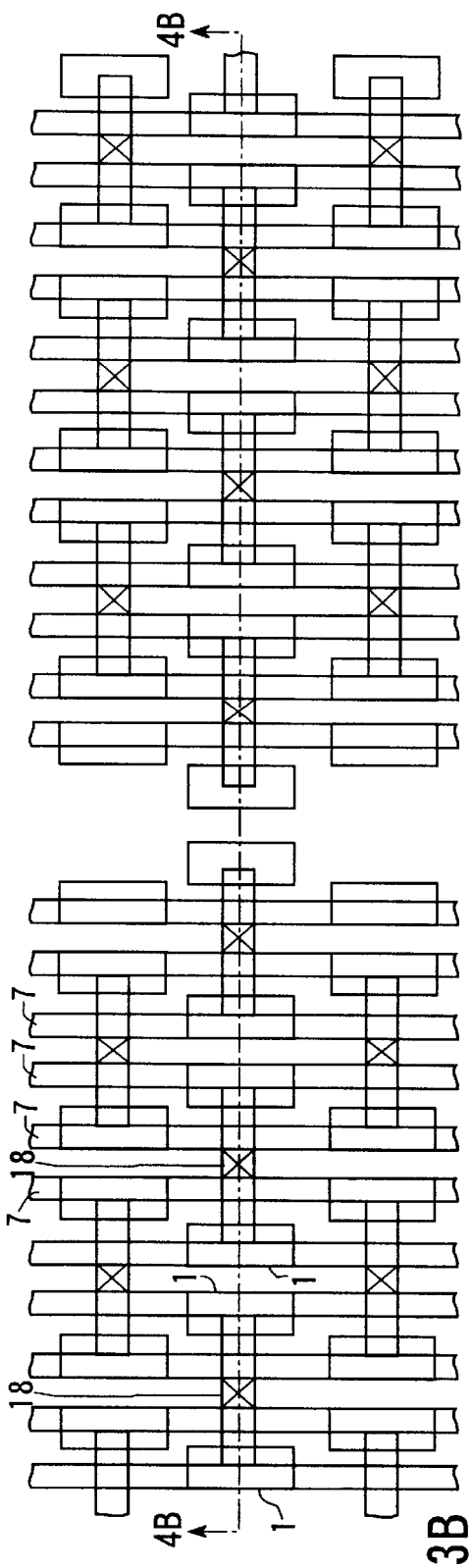
Figure 3C:
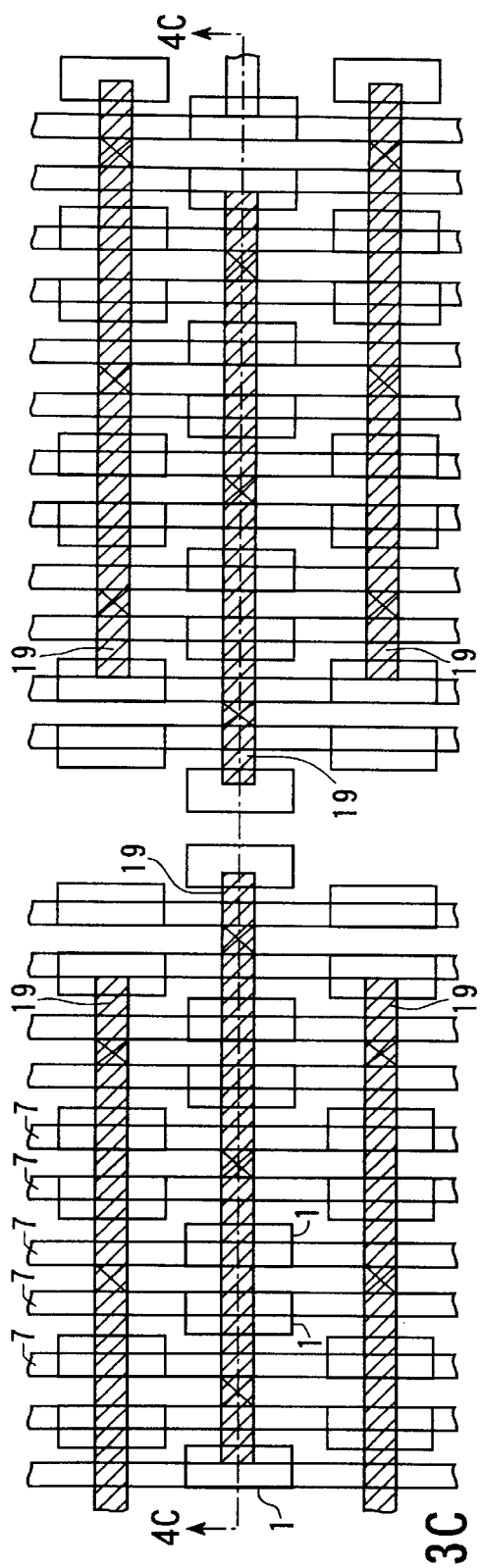
Figure 3D:
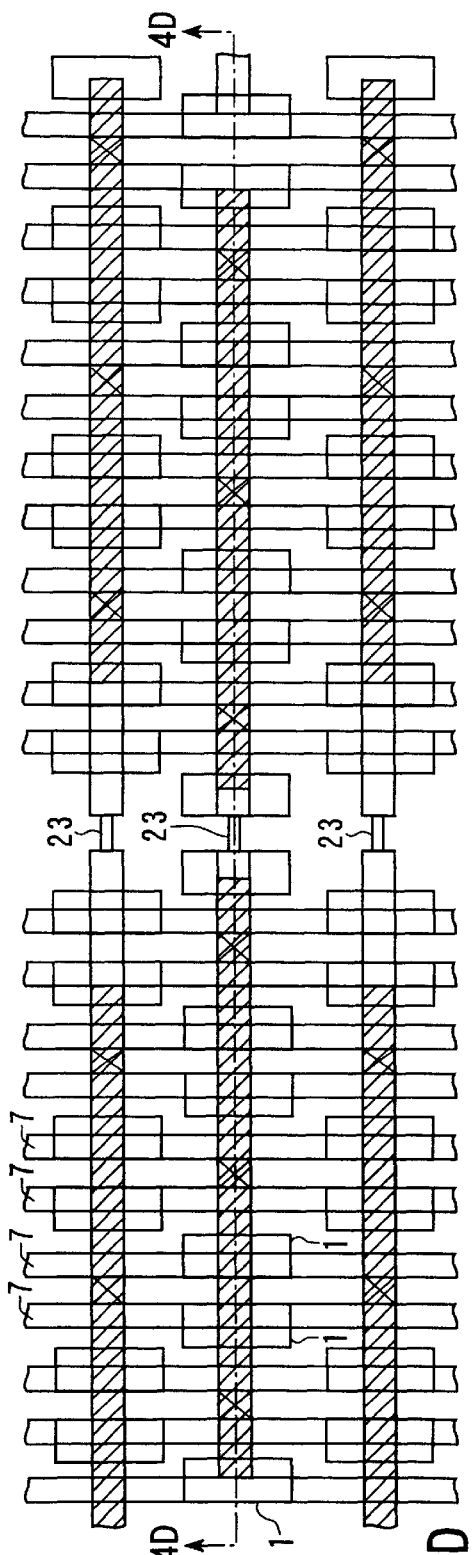
Figures 3E, 4E:
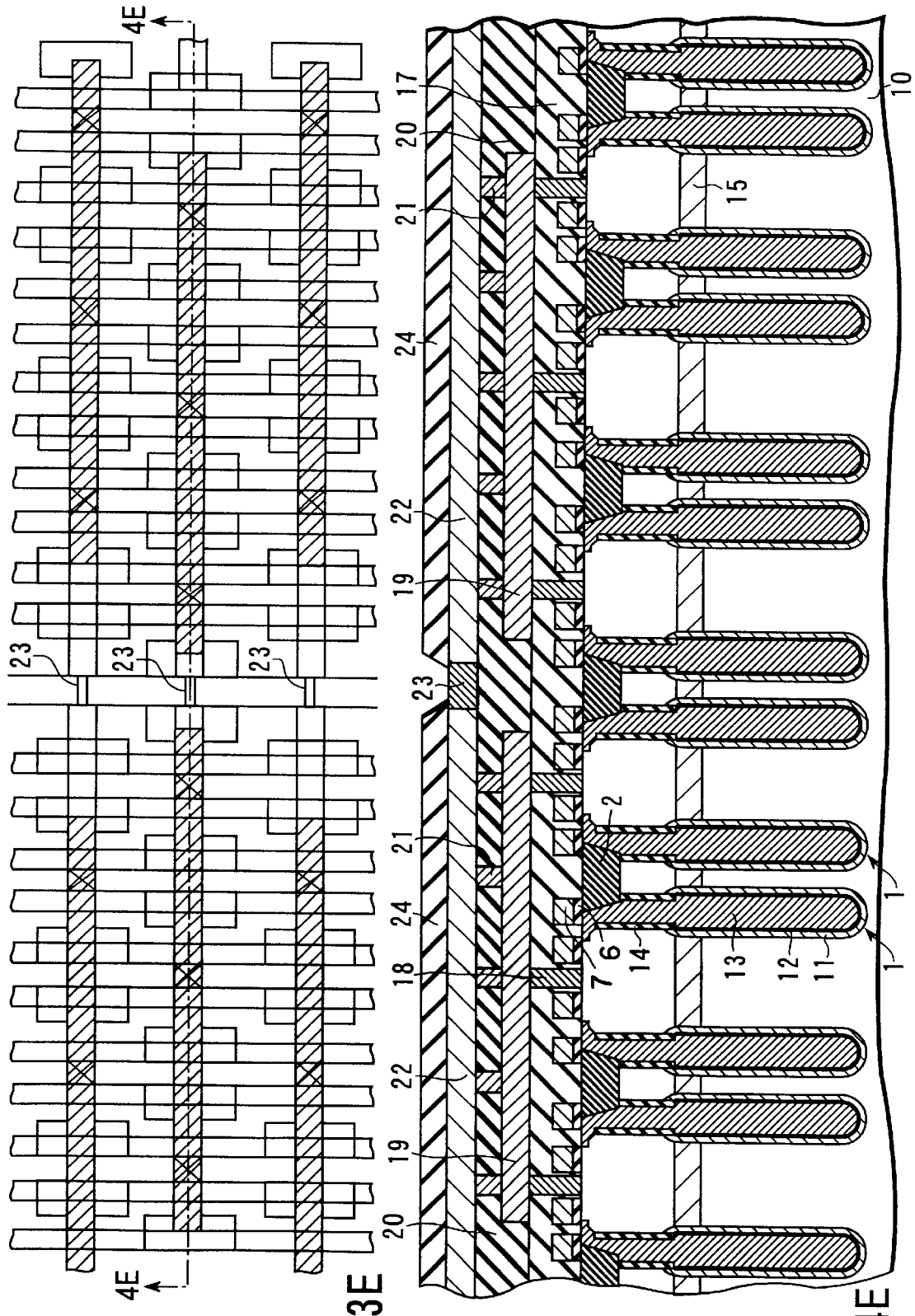
Figure 5:
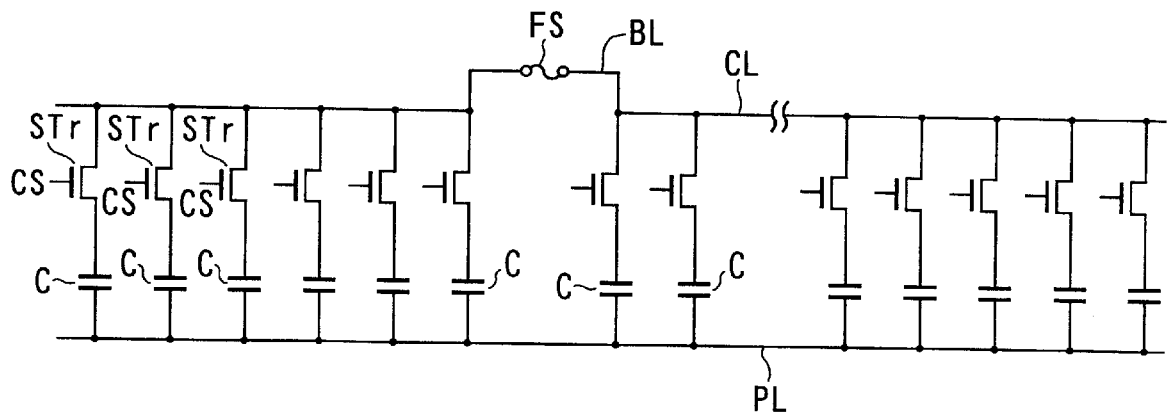
FIG. 5 is an equivalent circuit diagram of the capacitor block portion shown in FIGS. 3E and 4E.

FIG. 5 is an equivalent circuit diagram of the capacitor block portion shown in FIGS. 3E and 4E. One electrodes of the respective unit capacitors C, C, . . . shown in FIGS. 1E and 2E are commonly connected by means of a plate wiring (corresponding to the buried-plate region 15) PL. The other electrodes are commonly connected by a local connection wiring (corresponding to the capacitor electrode and the first-level metal wiring layer 19) CL through the current path of the selection transistors STr, STr, . . . . The capacitor blocks are commonly connected to each other by an intercapacitor-block connection wiring (corresponding to the second-level metal wiring layer 22 shown in FIG. 4E) BL and a fuse wiring (corresponding to the fuse element 23) FS.

Further, by selectively cutting the fuse wiring FS in accordance with the capacitance value of the capacitors required in view of the circuit design, the plurality of capacitor blocks can be selectively connected to each other or separated from each other, so that the resistance value can be easily altered from chip to chip. Further, by control signals CS, CS, . . . fed to the gates of the selecting transistors STr, STr, . . . , the selection transistors STr, STr, . . . are selectively ON/OFF-controlled, whereby the capacitance values of the respective capacitor blocks can also be finely adjusted.

As described above, In the DRAM-logic embedded integrated circuit according to the present invention, a plurality of trench type capacitors, which have so far not been used in circuits other than the memory cells, are formed in the logic circuit portion and used in a state connected in parallel. As a result, it becomes possible to realize a large capacitance value in the logic circuit portion by the use of trench type capacitors, so that, due to the feature of the trench structure that, by the use of a small flat surface, a large mutually opposed area of capacitor can be obtained, the pattern area occupied by the capacitors on the semiconductor substrate is reduced as compared with the case where planar type capacitors are used, and thus the degree of freedom in the circuit design is enhanced.

In addition, the capacitor blocks formed by trench type capacitors are connected to each other by the fuse elements 23, whereby an optional number of capacitor blocks can be used by selectively connecting them in parallel, so that, in the logic circuit portion, the capacitance value required of the capacitors in view of the circuit design can be freely altered in the logic circuit portion from chip to chip, and the connecting wirings between the capacitors can be freely adjusted from chip to chip.

Further, the connection and disconnection of the capacitors can be changed over therebetween by switching of the transistors STr, STr, . . . , so that the capacitance can be varied also by the ON/OFF of the transistors.

Figure 6:
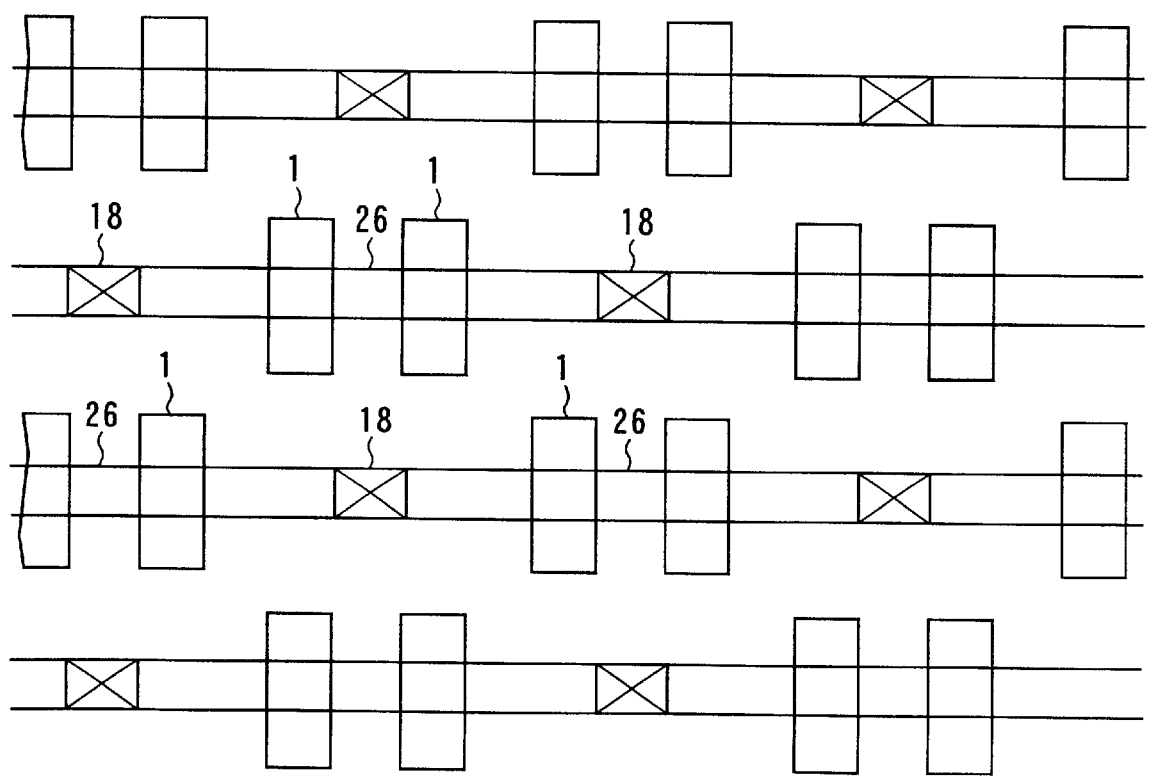
FIG. 6 is a plan view of the pattern for explaining a modification of the semiconductor device according to the above-mentioned first embodiment.

FIG. 6 is a plan view of a pattern for explaining a modification of the semiconductor device according to the first embodiment. This modified embodiment is constituted in such a manner that, on those portions of the major surface of the semiconductor substrate 10 which lie between the mutually adjacent trenches in the logic circuit portion, active regions 26 are formed, whereby the trench capacitors are connected to each other.

The trench capacitors in the logic circuit portion are used in a state connected in parallel, so that, even in the case of a pattern formation as mentioned above, a circuit arrangement similar to that according to the first embodiment can be realized, and thus, substantially the same effect can be obtained.

FIGS. 7A to 7E and FIGS. 8A to 8E are respectively plan views for explaining the semiconductor device according to a second embodiment of the present invention, wherein a different example of the pattern formation of the capacitor block portion formed in the logic circuit portion of the DRAM-logic embedded integrated circuit is shown in the order of the manufacturing steps, FIGS. 8A to 8E are, respectively, sectional views taken along the lines 8A—8A to 8E—8E drawn through the pattern shown in FIGS. 7A to 7E.

Figure 7A:
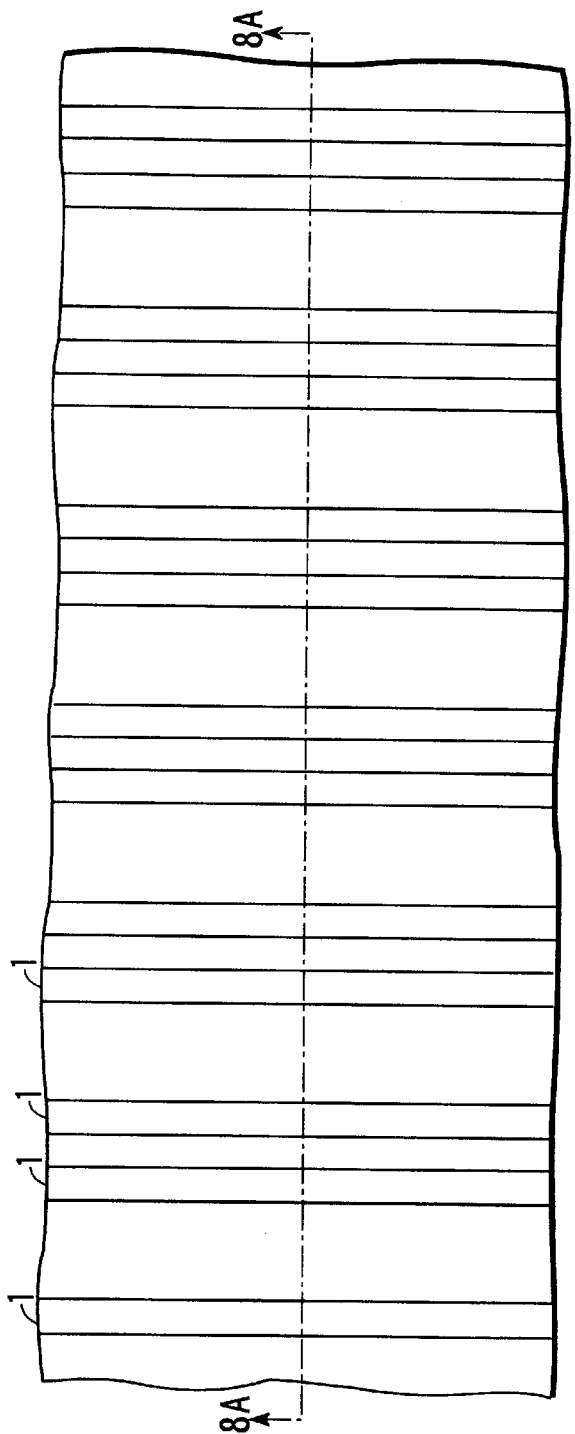
FIGS. 7A to 7E are plan views for explaining the semiconductor device according to a second embodiment of the present invention, showing an example of the pattern formation, in the order of the manufacturing steps, of the capacitor block portion formed in the logic circuit portion of the DRAM-logic embedded integrated circuit.
Figure 8A:
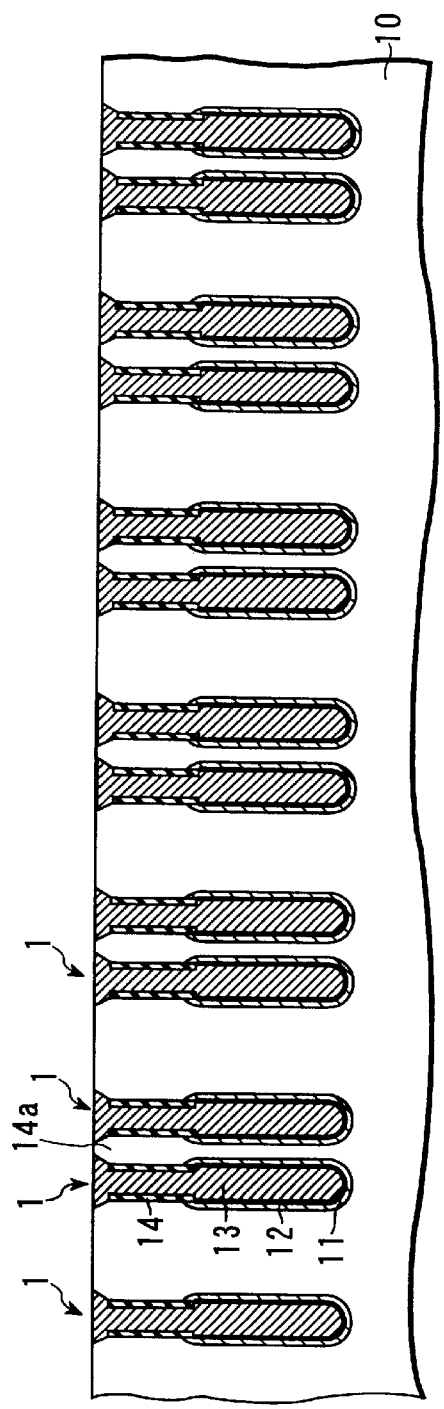
FIGS. 8A to 8E are sectional views taken along the lines 8A—8A to 8E—8E shown in FIGS. 7A to 7E.
Figure 7B:
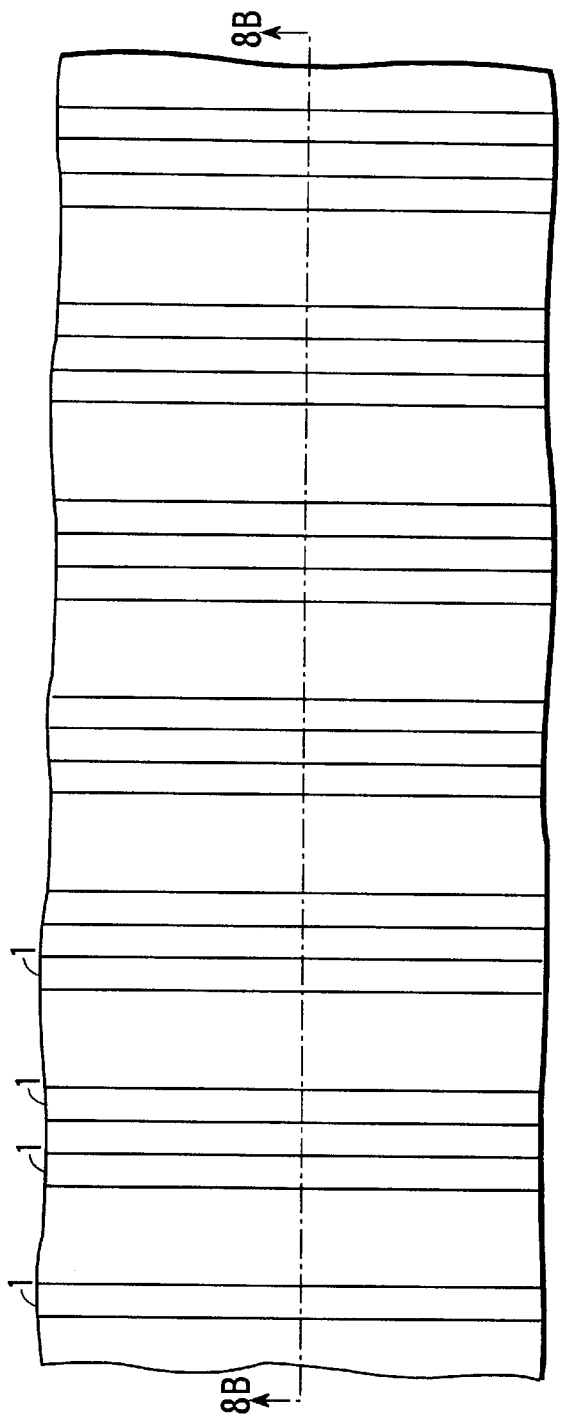
Figure 8B:
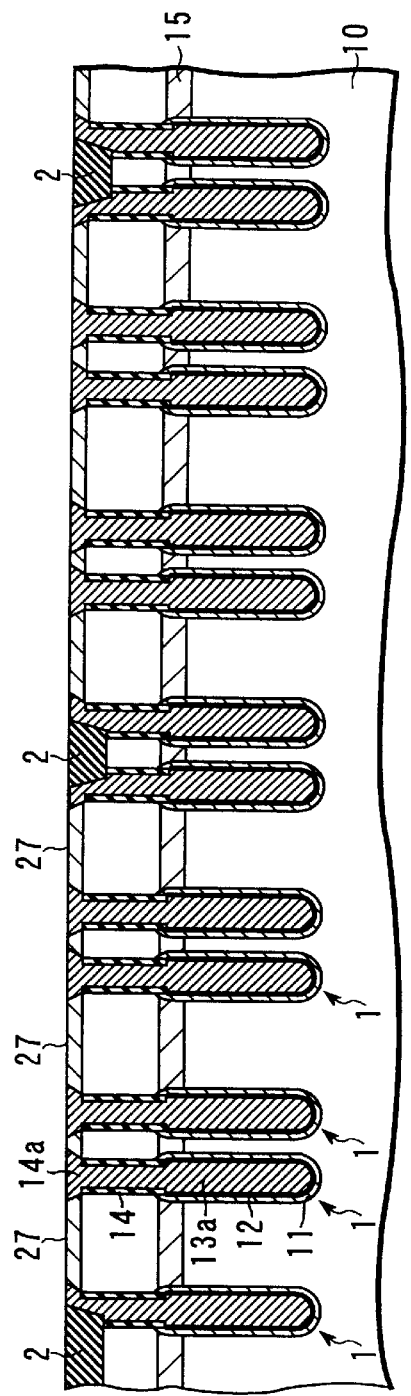
Figure 7C:
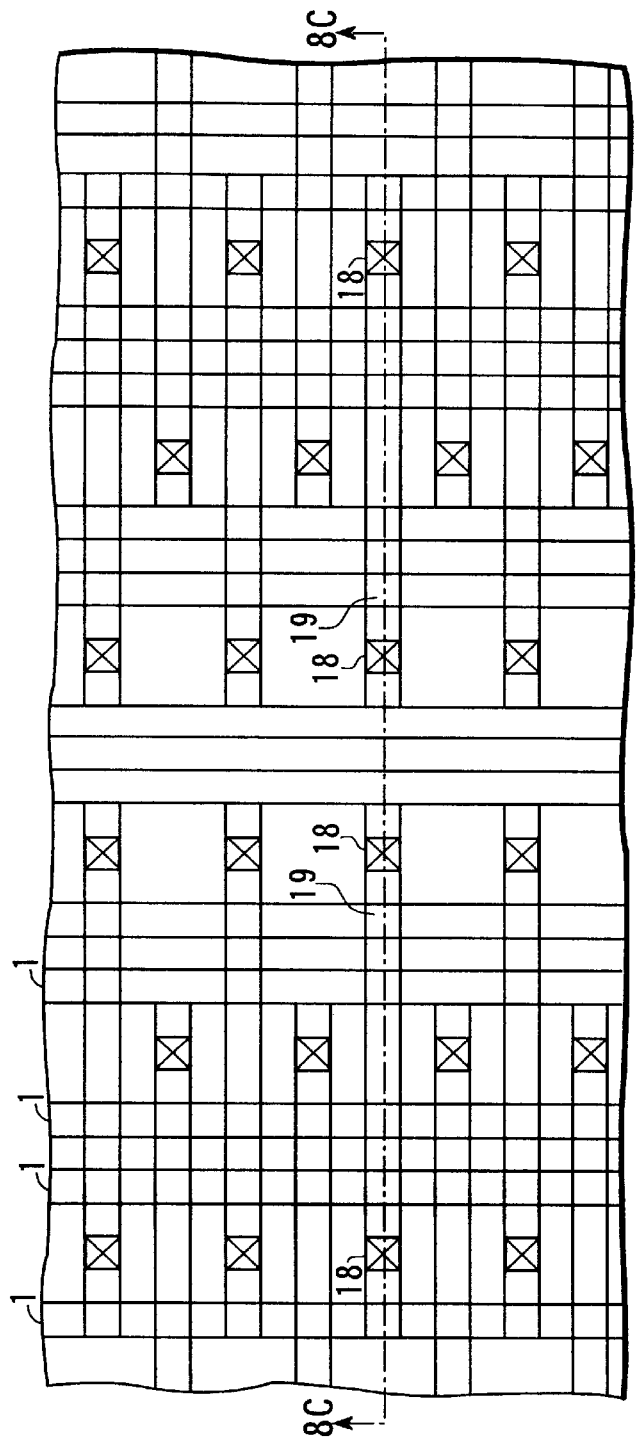
Figure 8C:
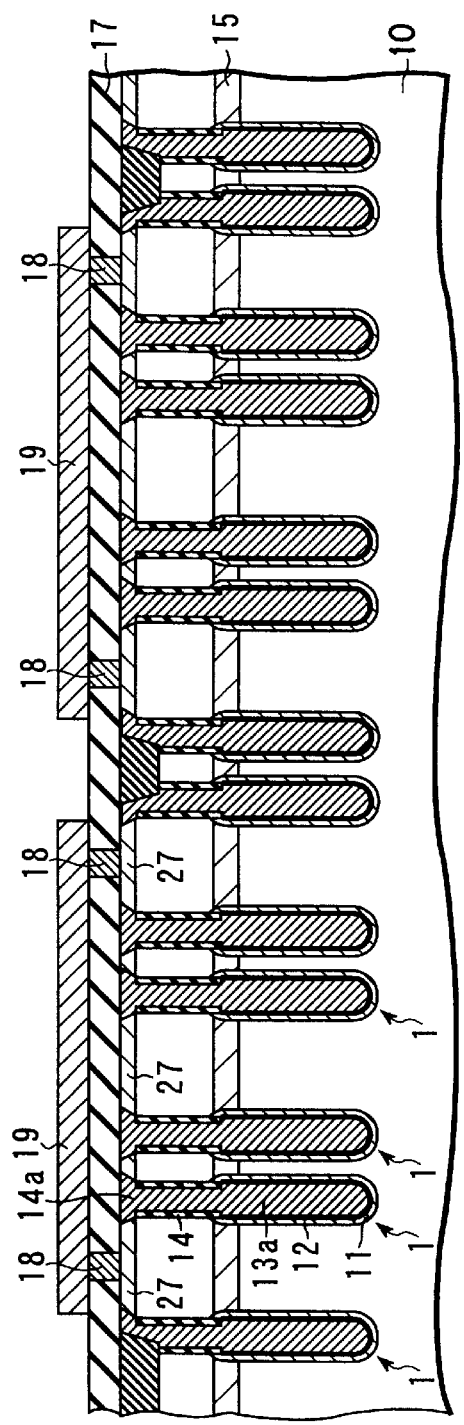
Figure 7D:
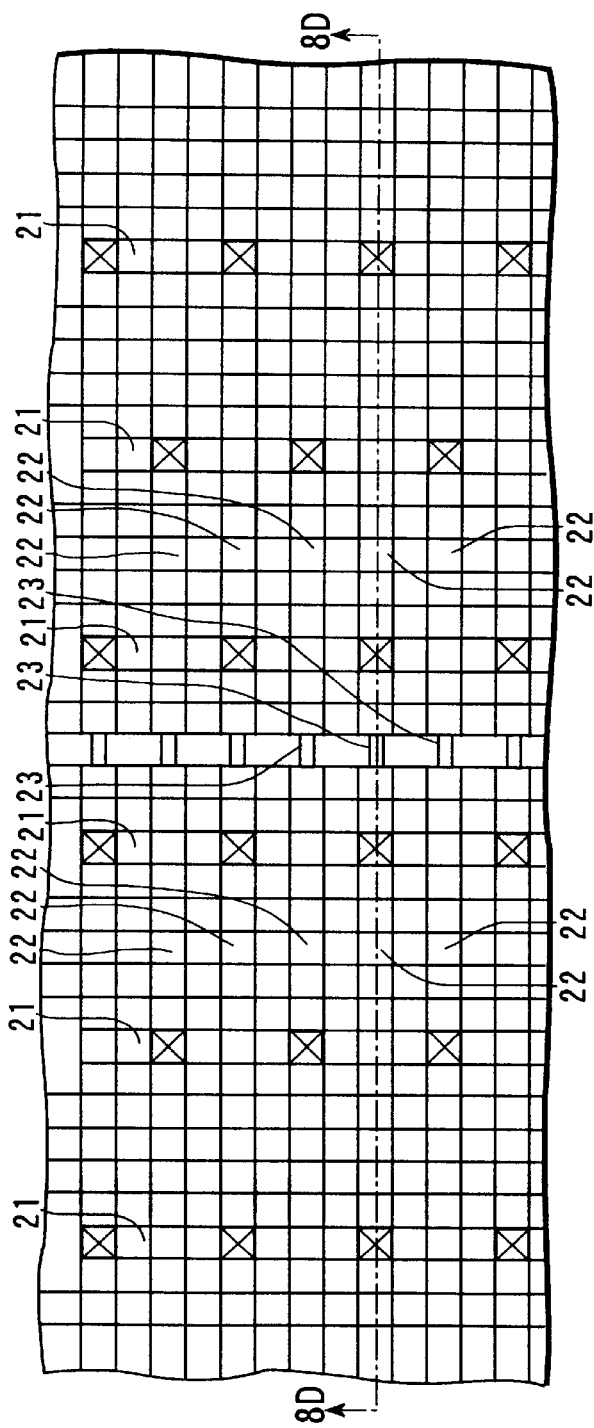
Figure 8D:
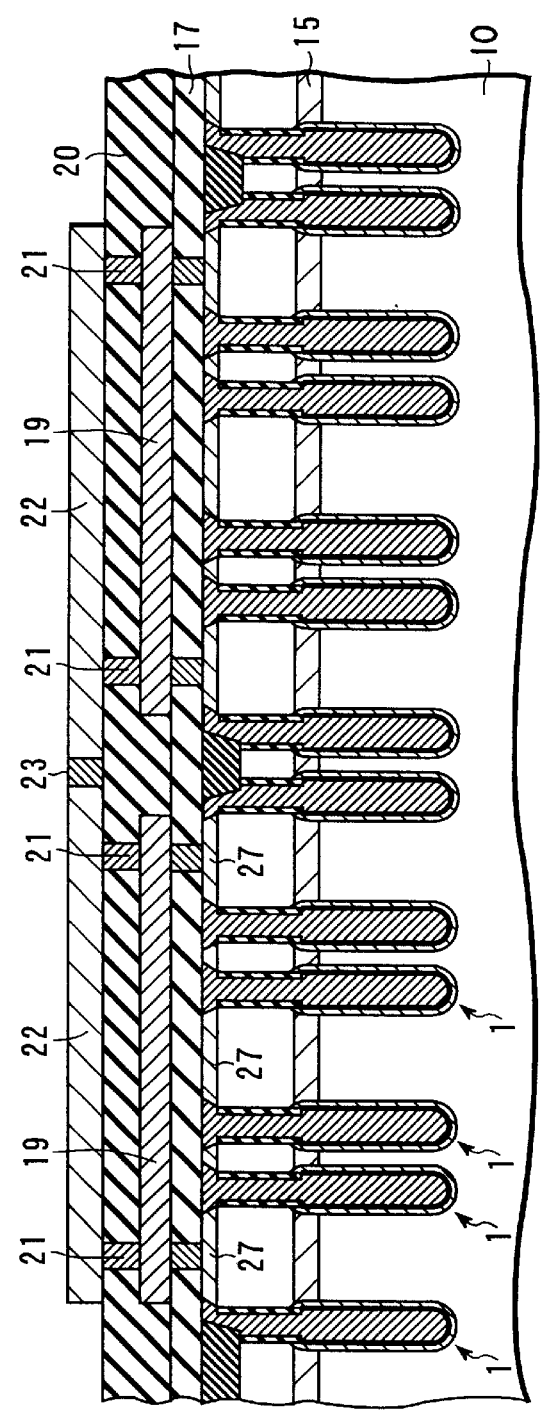
Figure 7E:
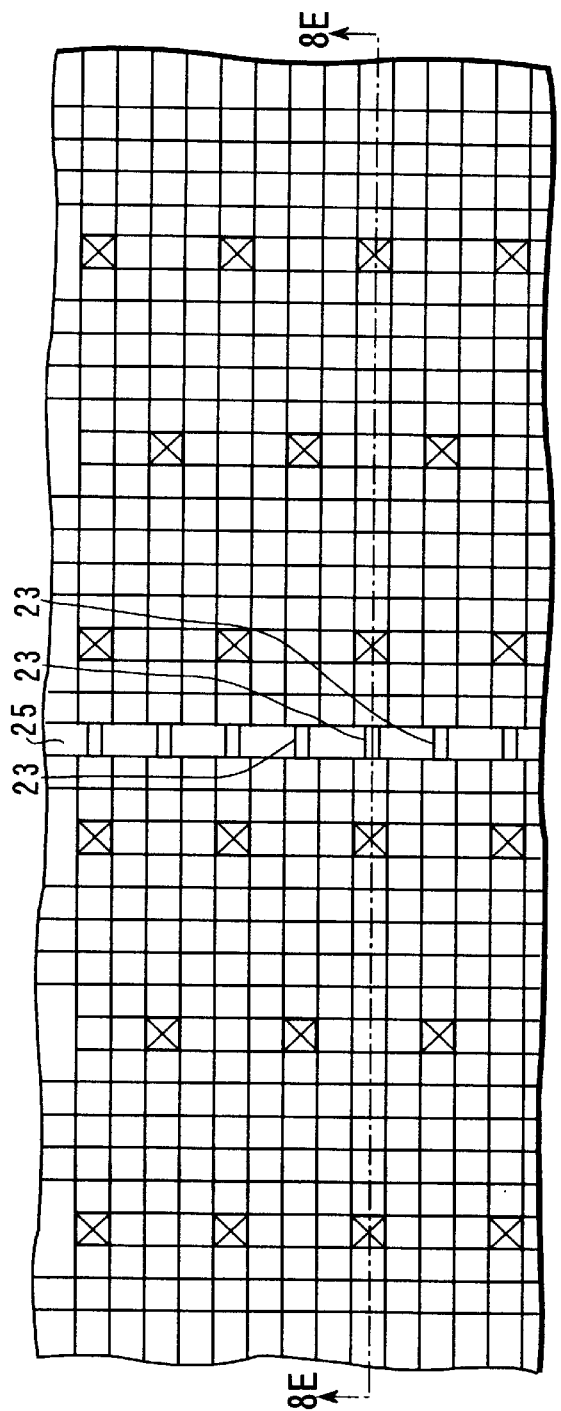
Figure 8E:
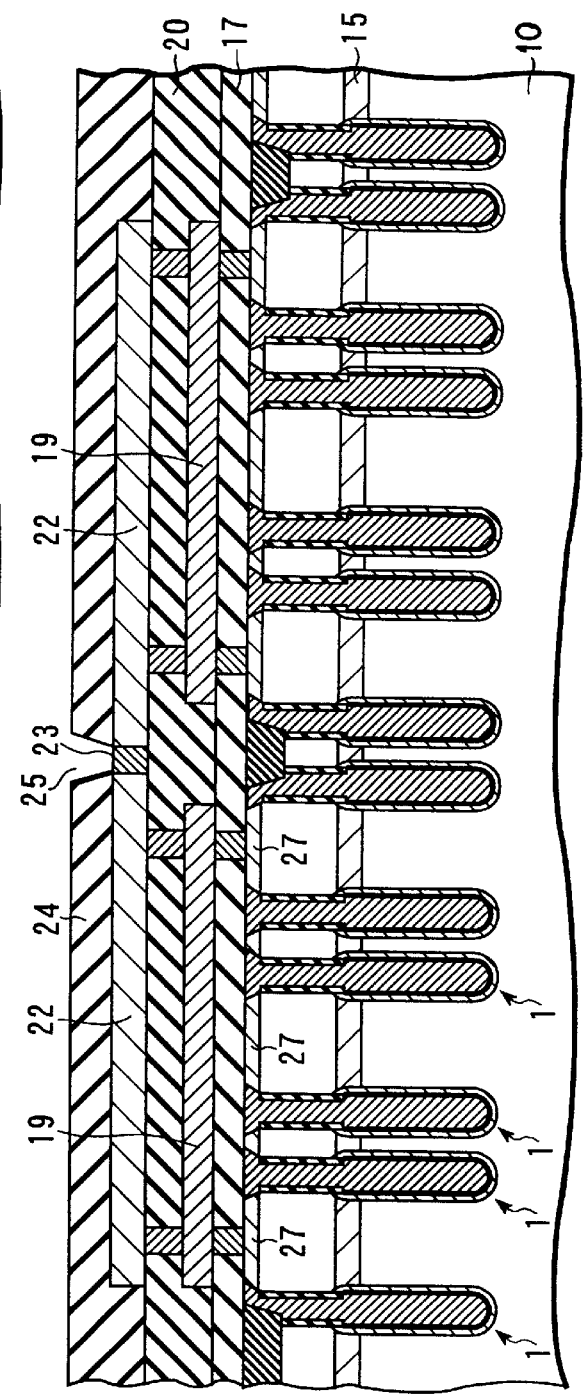

According to this second embodiment, as shown in FIGS. 7A and 8A, the pattern, in the plan view, of the trenches in the logic circuit portion has a formation different from that of the trench pattern in the DRAM portion, the trenches are made longer than the trenches in which the capacitors of the memory cells are formed. Further, as shown in FIG. 8B, no such selecting transistors as the selecting transistors in the logic circuit portion according to the first embodiment exist, and the adjacent capacitors are connected to each other through a diffused layer 27. Further, of a plurality of columns of capacitors, the group of those capacitors which are positioned in the same row have their charge storage layers 13a formed long so as to be commonly used by the plurality of rows of capacitors. In this case, the plurality of capacitors which commonly use the charge storage layers 13a buried in the trenches 1 formed long as mentioned above are connected in parallel due to their capacitor electrode regions commonly connected, thus constituting one capacitor block. Accordingly, in case a desired capacitance value is to be obtained by connecting two or more of those capacitor blocks which commonly use the charge storage layers 13a, such a measure can also be taken that the respective charge storage layers 13a in the respective capacitor blocks may be connected to each other through the first contact plugs 18, the first-level metal wiring layer 19, the second contact plugs 21, the second metal wiring layer 22, and the fuse elements 23.

According to the above-mentioned structure, the group of capacitors positioned on one and the same row are rendered into one capacitor block in such a manner that the charge storage layers 13a thereof are commonly used by a plurality of rows, and thus, the capacitance value can be set by a larger capacitance unit as compared with that of the first embodiment.

Figure 9:
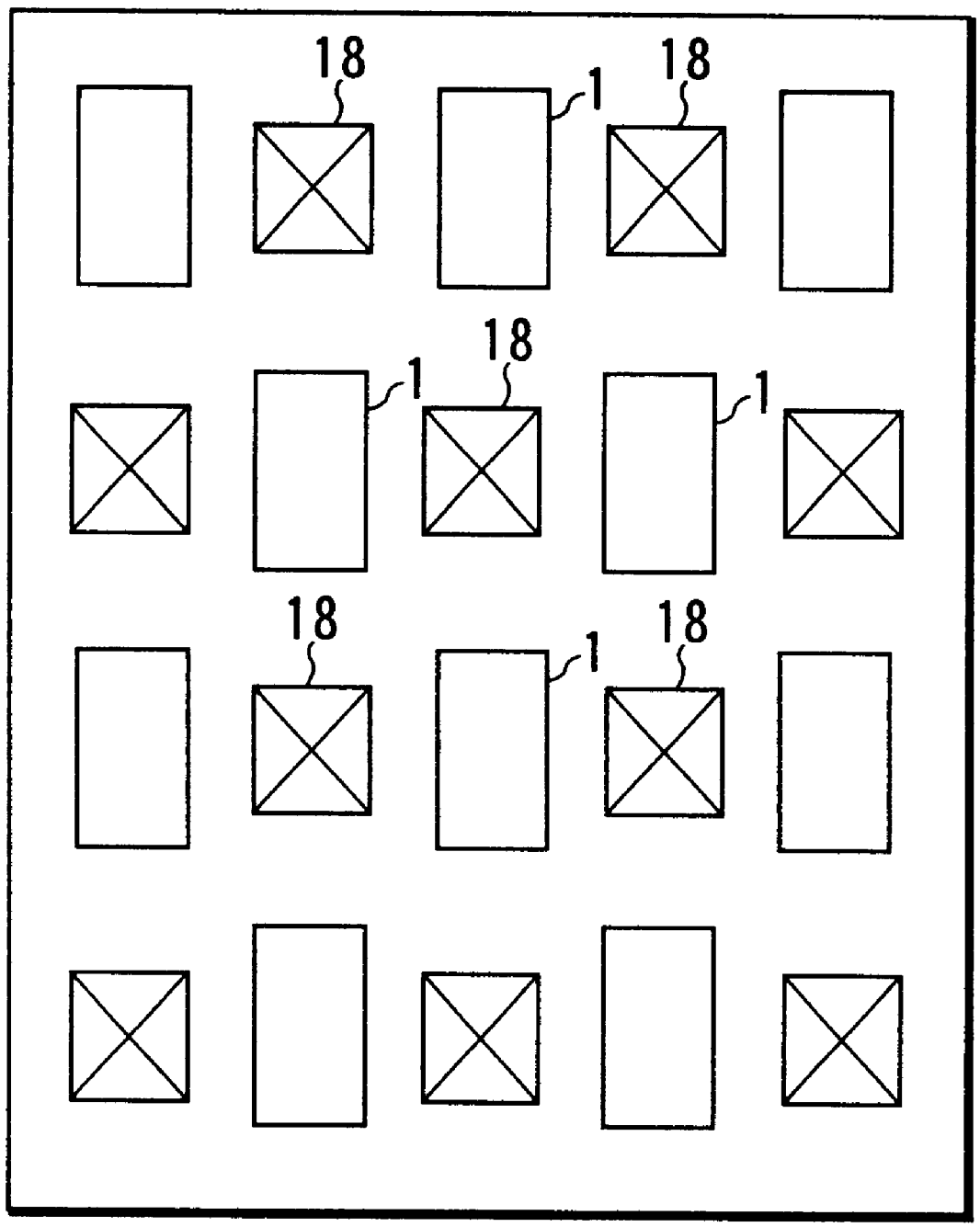
FIG. 9 is a plan view of the pattern for explaining a modification of the semiconductor device according to the second embodiment.

FIG. 9 is a plan view of the pattern for explaining a modification of the semiconductor device according to the second embodiment. In the case of this modified embodiment, contacts 18 are formed around the deep trenches in the logic circuit portion, whereby the respective trench capacitors are connected to each other in parallel.

The trench capacitors in the logic circuit portion have only to be connected in parallel, so that, even in the case of this structure, the respective capacitors can be connected in parallel.

In the above, the first and second embodiments have been described with reference to the case where the insulation films and film thickness of the capacitors in the DRAM portion and the logic circuit portion are formed at the same time, but it is a matter of course that the semiconductor device according to the present invention can alternatively be constituted in such a manner that the kind and thickness of the capacitor insulation films are varied as in the case where, for instance, the insulation films of the capacitors in the logic circuit are thickened to enhance the dielectric breakdown voltage.

Further, the structure of the trench capacitors is not limited only to the structures set forth in connection with the foregoing first and second embodiments, but the present invention can also be applied to various other trench capacitor structures.

As has been described above, according to the present invention, a capacitance larger than the capacitance constituted by planer capacitors can be obtained by the use of a small pattern area occupied, and the present invention is particularly suitable for use for, e.g. the power supply stabilizing capacitance of a stabilized power supply circuit which requires a large capacitance by the use of a small occupied pattern area.

Further, in the case of a DRAM-logic embedded integrated circuit, if planar capacitors are used, then the number of deep trenches in the DRAM portion and that in the logic circuit portion largely differs from each other, which causes a DT loading effect, and, as a result, the processing conditions in the two portions become different from each other, but, in the case of the present invention, deep trenches are disposed also in the peripheral portion other than the memory cells, so that the ratio of the deep trenches with respect to the chip area can be increased, thus suppressing the loading effect.

Further, as in the case of memory cells, the connection and disconnection of the capacitors can be changed over therebetween by the switching of transistors. Therefore, the capacitance can be changed by the ON/OFF of the transistors, and thus, the device according to the present invention can also be utilized as a variable capacitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of first trench capacitors formed in a DRAM portion of a DRAM-logic embedded integrated circuit;
   a plurality of second trench capacitors formed in the logic circuit portion of the DRAM-logic embedded integrated circuit, ones of electrodes of said plurality of second trench capacitors being commonly connected;
   a wiring portion which electrically connects said plurality of second trench capacitors in parallel by commonly connecting other ones of electrodes of said plurality of second trench capacitors, to form a plurality of capacitor block; and
   connection/separation circuit which selectively connects said wiring portions to each other or separates them from each other to thereby vary the capacitance value of said capacitor block,
   wherein said second trench capacitors are of the same structure as that of first trench capacitors.

2. The semiconductor device according to claim 1, wherein said plurality of second trench capacitors are deep trench type capacitors, respectively,
   said deep trench Wte capacitors each including a capacitor electrode formed on the surface of the lower portion of the interior of the respective trench formed in said semiconductor substrate, a capacitor insulation film formed on the sidewall of the trench on the surface of said capacitor electrode in said trench, a buried strap which is opened in an insulation film collar formed on the side wall of the upper portion of the interior of said trench, and a charge storage layer buried in said trench,
   said wiring portions include a buried plate wiring which is formed in a state buried in a semiconductor substrate and connect together the upper portions of the respective capacitor electrodes of a plurality of capacitors, and inter-strap junction diffused layers which are formed in the surface layer portion of said semiconductor substrate so as to connect to the upper portions of the charge storage layers of said plurality of capacitors, and
   said connection/separation means include fuse elements which are formed so as to connect the respective wiring portions of said capacitor blocks to each other, said fuse element being selectively cut off.

3. The semiconductor device according to claim 2, wherein said wiring portions further include a first-level metal wiring layer which is contacted with inter-strap junction diffused layers formed so as to connect to the upper portions of the charge storage layers of said plurality of capacitors.

4. The semiconductor device according to claim 2, wherein
   said semiconductor device further comprises a second-level metal wiring layer which is formed on said first-level metal wiring layer and commonly connects the first-level metal wiring layers from capacitor block to capacity block, and
   said fuse elements connect together the second-level metal wiring layers to each other in said respective capacitor blocks.

5. The semiconductor device according to claim 4, wherein said fuse elements are formed of the same material as that of said second-level metal wiring layer.

6. The semiconductor device according to claim 1, wherein the length of the trenches of said second trench capacitors is larger than that of the trenches of said first trench capacitors.

7. The semiconductor device according to claim 6, wherein said second trench capacitors differ from said first trench capacitors in respect of the material and thickness of the capacitor insulation films.

8. A semiconductor device comprising:
   a plurality of first trench capacitors formed in the memory cells of the semiconductor device;
   a plurality of second trench capacitors formed in the circuit portion other than the memory cells of the semiconductor device, ones of electrodes of said plurality of second trench capacitors being commonly connected;
   a wiring portion which electrically connects said plurality of second trench capacitors in parallel by commonly connecting other ones of electrodes of said plurality of second trench capacitors, to form a plurality of capacitor block; and
   connection/separation circuit which selectively connects said wiring portions to each other or separates them from each other to thereby vary the capacitance value of said capacitor block;
   wherein said second trench capacitors are of the same structure as that of first trench capacitors.

9. The semiconductor device according to claim 8, wherein said wiring portions further include a first-level metal wiring layer which is contacted with inter-strap junction diffused layers formed so as to connect to the upper portions of the charge storage layers of said plurality of capacitors.

10. The semiconductor device according to claim 8, wherein said semiconductor device further comprises a second-level metal wiring layer which is formed on said first-level metal wiring layer and commonly connects the first-level metal wiring layers from capacitor block to capacity block, and said fuse elements connect together the second-level metal wiring layers to each other in said respective capacitor blocks.

11. The semiconductor device according to claim 10, wherein said fuse elements are formed of the same material as that of said second-level metal wiring layer.

12. The semiconductor device according to claim 8, wherein the length of the trenches of said second trench capacitors is larger than that of the trenches of said first trench capacitors.

13. The semiconductor device according to claim 12, wherein said second trench capacitors differ from said first trench capacitors in respect to the material and thickness of the capacitor insulation films.

* * * * *

UNITED STATES PATENT AND TRADEMARK OFFICE
CERTIFICATE OF CORRECTION

PATENT NO.   : 6,278,149 B1
DATED        : April 16, 2002
INVENTOR(S)  : Wataru Sato et al.

It is certified that error appears in the above-identified patent and that said Letters Patent is hereby corrected as shown below:

Column 7,
Line 50, delete "Wto" and insert -- type --,

Signed and Sealed this

Ninth Day of July, 2002

Attest:

Attesting Officer

JAMES E. ROGAN
Director of the United States Patent and Trademark Office